Dec. 27, 1966 J. E. WISECARVER 3,294,984

RING COUNTER STARTING CIRCUIT EMPLOYING OR GATE FOR PRESELECTING STARTING STAGE AND THEN ISOLATING STARTING CIRCUIT

Filed Feb. 20, 1964 2 Sheets-Sheet 1

INVENTOR.
JACK E. WISECARVER
BY
Moody and Phillion
ATTORNEYS

RING COUNTER STARTING CIRCUIT EMPLOYING OR GATE FOR PRESELECTING STARTING STAGE AND THEN ISOLATING STARTING CIRCUIT

Filed Feb. 20, 1964 2 Sheets-Sheet 2

INVENTOR.
JACK E. WISECARVER
BY
Moody and Phillion
ATTORNEYS

United States Patent Office 3,294,984

Patented Dec. 27, 1966

3,294,984

RING COUNTER STARTING CIRCUIT EMPLOYING OR GATE FOR PRESELECTING STARTING STAGE AND THEN ISOLATING STARTING CIRCUIT

Jack E. Wisecarver, Santa Ana, Calif., assignor to Collins Radio Company, Cedar Rapids, Iowa, a corporation of Iowa Filed Jan. 20, 1964, Ser. No. 338,650

4 Claims. (Cl. 307—88.5)

Figure 1:
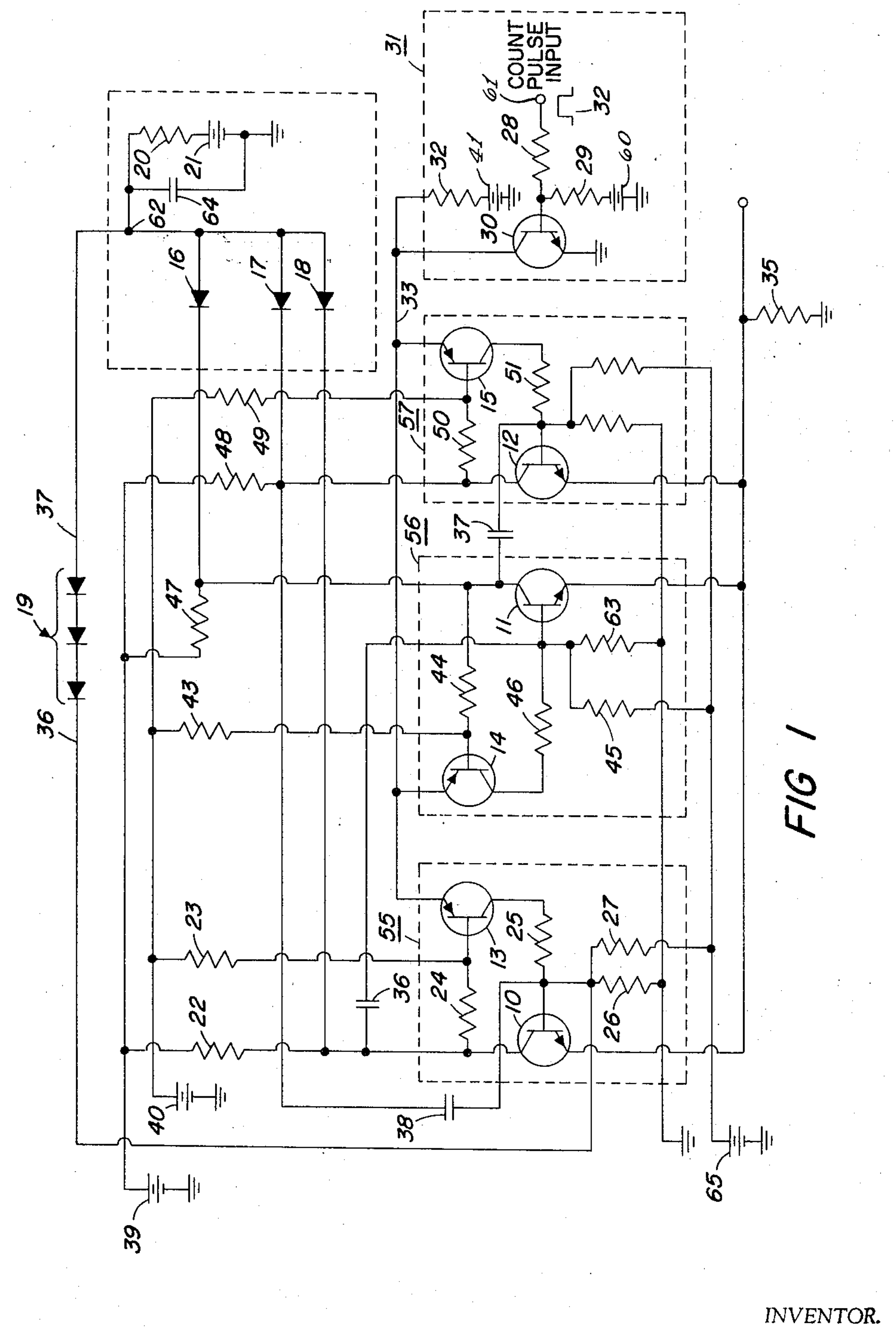

This invention relates generally to means for starting a ring counter and, more specifically, to a circuit means for initiating the count of a ring counter at a particular stage thereof.

Many existing counter rings are constructed of a series of bistable devices, such as flip-flop circuits, with each flip-flop circuit constituting a stage of the ring counter. Each flip-flop circuit may consist of a pair of transistors or vacuum tubes with the output of one of the collectors of the transistors, if transistors are used, being connected to the input of the next stage through a capacitor. The input of said next stage usually comprises the base electrode of one of the transistors. A particular stage of the transistor is herein defined as being an "on" condition when containing the count of the counter, with the remaining stages which do not contain a count being in an "off" condition. If NPN transistors are employed in the flip-flop circuits, the potential of the collector electrode of the flip-flop which is on will be low. An input pulse supplied to the stages of the counter functions to turn to an off condition all such stages. Thus, when the flip-flop circuit which was in an on condition suddenly assumes an off condition, the collector potential thereof will rise sharply, with the positive-going pulse passing through the capacitor connecting the collector electrode thereof to the input of the next following stage, and causing the said next succeeding flip-flop to assume an on condition. In such a manner the count is advanced along successive stages of the counter with each succeeding input counting pulse.

When the counter is initially energized, it is often desired that a particular stage be energized. That is to say, it is desired that the count always begins from a given stage of the counter. Such predetermination of the starting stage is frequently accomplished by biasing one of the stages in such a manner that it will automatically turn on when the counter is energized. Subsequently, when counting pulses are supplied to the counter, the bias is partially removed owing to the conduction of subsequent stages which, in essence, locks out or prevents any other stage thereof from being in an on condition. However, in most prior art devices such biasing potentials remain during operation and pose a possible source of error in counting.

An object of the present invention is a means for energizing a particular stage of a counter when the counter is initially energized and in which said initial bias is completely removed once any stage of the counter is energized.

A second aim of the invention is a circuit for predetermining the stage from which counting shall begin when the counter is first energized.

A third purpose of the invention is the improvement of ring counter circuit means, generally.

In accordance with the invention, there is provided a clamping circuit consisting of a plurality of diodes which connect a common terminal to the output terminal of each of the counter stages. Said diodes are connected in such a manner that their high impedances are presented to the output terminals of the various stages of the counter. Also connected to the common terminal is a series combination of an impedance, preferably a resistive impedance, and a battery source. When all the stages of the counter are in an on condition, the potential of the output terminals thereof is at a maximum positive potential, assuming NPN transistors are being employed, so that the potential of the common terminal is at, or near, said maximum positive potential of the counter stages output terminals. Also connecting said common terminal to the input of the predetermined first stage of the counter is an isolating impedance means for substantially isolating the potential of said common terminal from said input, as long as the potential of said common terminal is below a predetermined level.

When no stage of the counter is energized, the potential of said common terminal is sufficiently high to cause a breakdown of said isolating impedance means to a low value, thus causing energization of said predetermined stage of the counter. Once any of the stages of the counter is energized to an on condition, the potential of said common terminal will decrease to the level of the output potential of the energized stage. At this potential the value of said isolating impedance is quite high, effectively isolating the potential of said common terminal from the input of said predetermined starting stage. Thus, the starting potential bias is completely removed from the input of the starting stage.

Figure 2:
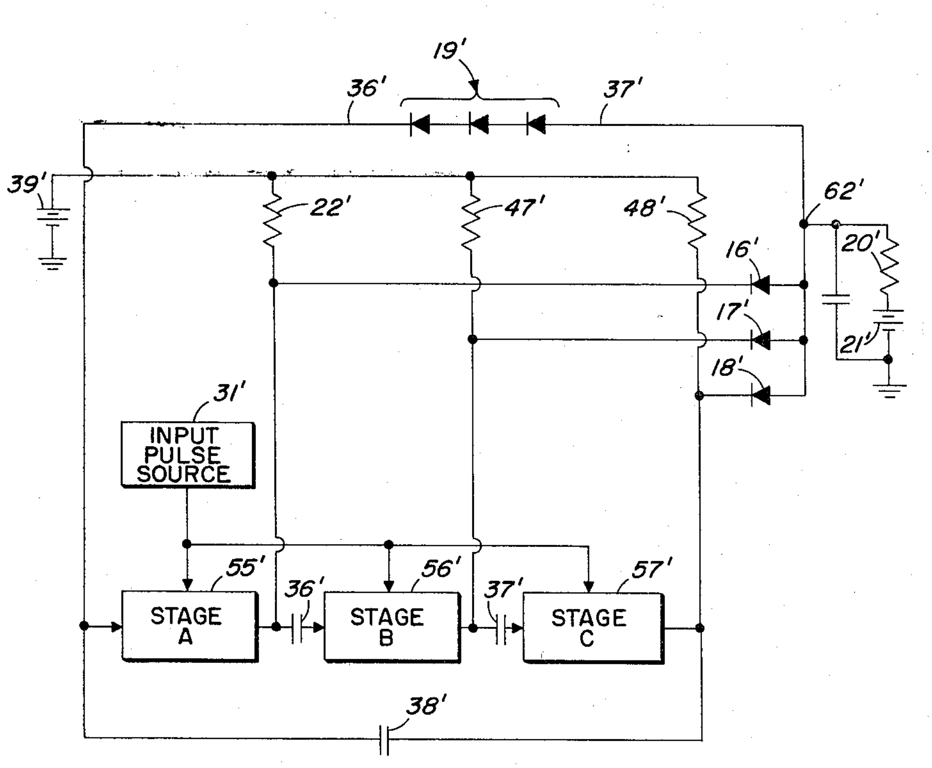

The above and other objects and features of the invention will be more fully understood from the following description thereof when read in conjunction with the drawings in which:

FIG. 1 shows a schematic diagram of a preferred embodiment of the invention when used in conjunction with a ring counter having transistorized flip-flop circuit stages; and FIG. 2 is a combination block diagram and a schematic diagram of a more generalized form of the invention illustrating the adaption thereof to ring counter circuits generally.

Refering now to the circuit of FIG. 1, the ring counter circuit will be discussed first in order to provide the necessary background for an understanding of the inventive portion of the circuit which comprises the means for energizing a particular stage of the ring counter when said ring counter is first turned on.

In FIG. 1 the ring counter consists of three stages 55, 56, and 57; each of said stages comprising a flip-flop circuit having two transistors. For example, stage 55 has therein transistors 10 and 13 which, together with the associated circuitry to be described later, comprise a flip-flop circuit. The battery source 39 supplies voltage to the collectors of transistors 10, 11, and 12 through collector resistors 22, 47, and 48, respectively. The D.-C. voltage supply for transistors 13, 14, and 15 is derived from battery source 41 through common resistor 32. Biasing voltage for the base electrodes of transistors 13, 14, and 15 is derived from the battery source 40 through resistors 23, 43, and 49, respectively, which, together with other resistors in the circuit, and with the collector potential of the transistors 10, 11, and 12 function to form voltage divider circuits which determine the potential of the base electrodes of transistors 13, 14, and 15.

Generally speaking, the transistors 10, 11, and 12 comprise the main transistor of each counter stage and it is from the collector electrodes of these transistors 10, 11, and 12 that the output signals are taken and supplied to the next subsequent stage. The transistors 13, 14, and 15 function as locking circuits for transistors 10, 11, and 12. More specifically, once any one of the transistors 10, 11, or 12, have become nonconductive, the corresponding transistor of transistors 13, 14, or 15 will also become conductive in a manner to be described later herein, and will maintain the associated transistor 10, 11, or 12, in a conductive state.

Assume, for purposes of discussion, that a steady stage condition exists whereby the transistors 10 and 13 of stage 55 are both conductive. Assume, also, that transistors 11 and 12, and their associated locking transistors 14 and 15, are in a nonconductive condition. Under such circumstances, the emitter potential of transistor 10 is determined by the current flow through the common emitter resistor 35, which potential in the particular embodiment of the invention described herein is about one volt. Thus, the potential of the collector electrode of conductive transistor 10 is also about one volt. Such one volt potential on the collector of transistor 10 is, of course, a much smaller potential than would exist if transistor 10 were nonconductive. Consequently the base potential of transistor 13 is less when the transistor 10 is conductive than when transistor 10 is nonconductive. Such decrease in the potential of the base of transistor 13 is sufficient to cause the transistor 13 to become conductive. In turn, the conductivity of transistor 13 functions to raise the potential of the base of transistor 10 in a circuit traceable from battery source 41, through resistor 32, transistor 13 and resistor 25 to the base of transistor 10. The transistor 10 is thereby caused to remain in a conductive state.

Assume now that a counting pulse, such as counting pulse 32, is supplied on input lead 61 through resistor 28 to the base of transistor 30. Said transistor 30 is normally in a nonconductive state due to the biasing effect of battery 60 through resistor 29. However, the positive pulse 32 is of sufficient amplitude to cause transistor 30 to become conductive and thereby lower the potential of lead 33 to about +1 volt from its normal potential of approximately +7 or +8 volts. The decrease in the potential of lead 33 is sufficient to cause transistor 13 to become nonconductive since the potential of the emitter of transistor 13 falls below the base potential thereof. When transistor 13 becomes nonconductive, the potential of the base of transistor 10 decreases towards ground potential through resistor 26 and transistor 10 becomes nonconductive. When transistor 10 becomes nonconductive, the collector potential thereof increases sharply to cause a positive pulse to be supplied to the base of transistor 11 through capacitor 36, and of a magnitude to cause the transistor 11 to become conductive. As transistor 11 becomes conductive, the potential of its collector electrode decreases towards ground potential which will, in turn, cause the locking transistor 14 associated therewith to become conductive, also. The effect of the locking transistor 14 on transistor 11 is the same as the effect of locking transistor 13 of stage 55 is upon the transistor 10 thereof.

It will be apparent that as additional counting pulses are supplied to the input lead 61, the ring counter will count successively from stage to stage.

When the ring counter is initially turned on there is, in the absence of the present invention, no means for determining which of the stages will become conductive first and thereby lock out the remaining stages. The present invention functions to insure that a particular stage (stage 55 in FIG. 1) will become conductive when the power is first supplied to the counter. The three diodes 16, 17, and 18 have their cathodes connected, respectively, to the collectors of transistors 10, 11, and 12, and their anodes connected to common terminal 62. Also connected to the common terminal 62 is a battery source 21 through the resistor 20, by-passed by RF bypass capacitor 63. The potential of battery 21 is selected to be greater than the greatest possible potential of the collector electrodes of any of transistors 10, 11, and 12. Under such circumstances it is apparent that the battery source 21 will tend to increase the potential of the common terminal 62 in a positive direction, whereas the effect of the potential of the collector electrodes of transistors 10, 11, and 12 through the diodes 16, 17, and 18 is to decrease the potential of the common terminal 62 to the lowest potential of said three collector electrodes (essentially an OR function).

In the case where the power supply has just been supplied to the counter, none of the stages will be in a conductive condition and the potential of the collector electrodes of transistors 10, 11, and 12 will be at their high level so that the potential of the point 62 will be at a high potential level. At such high potential level the diodes 19 will become quite conductive and said high level potential will be supplied to the base of transistor 10, thus causing transistor 10 to become conductive. Conductivity of transistor 10 will, in turn, cause transistor 13 to become conductive, thus initiating operation of the ring counter circuit.

As soon as transistor 10 becomes conductive, however, its collector potential will fall so that the potential of the common terminal 62 will also decrease accordingly through the diode 18. More specifically, the potential of the common terminal 62 will now drop to a value below the conductive threshold of the three diodes 19, so that said three diodes 19 now constitute a completely isolating impedance between the common terminal 62 and the base of transistor 10.

In one preferred embodiment of the invention, the following circuit constants can be employed:

| | |
|---|---|
| R22=1.5K | R63=22K |
| R23=2.2MΩ | R51=6.8K |
| R43=2.3MΩ | R52=22K |
| R47=1.5K | R53=470K |
| R48=1.5K | R28=6.8K |
| R49=2.2MΩ | R29=22K |
| R20=10K | R32=1.5K |
| R24=22K | C38=.001 mmf. |
| R25=6.8K | C36=.001 mmf. |
| R44=22K | C37=.001 mmf. |
| R46=6.8K | E39=+5 v. |
| R50=22K | E40=+10 v. |
| R25=6.8K | E21=+10 v. |
| R26=22K | E60=−10 v. |
| R27=470K | E41=+10 v. |
| R46=6.8K | E65=−5 v. |
| R45=470K | |

Diodes 16, 17, and 18 are of the type 1N483B. Transistors 10, 11, and 12 are of the 2N708 type and transistors 13, 14, and 15 are of the 2N861 type.

Referring now to the circuit of FIG. 2, there is shown a more generalized form of the invention, in which the stages of the ring counter are shown as three blocks 55′, 56′, and 57′ coupled together by coupling capacitors 36′, 37′, and 38′. An input pulse source 31′ functions to supply pulses simultaneously to the three stages of the ring counter circuit. The primary purpose of the diagram of FIG. 2 is to illustrate the fact that the invention can be employed or utilized with many different types of ring counter circuits; the primary requisites being that there be a point on each circuit at which the potential level will assume one of two levels indicating whether the particular stage is in an on or an off condition, i.e., whether the particular stage contains a count. Such three points usually exist at the output of the stages of the counter as indicated in both FIG. 1 and FIG. 2, although other electrical points in each of the stages could be used for this purpose. The potential of these three points are supplied, respectively, to the three diodes 16′, 17′, and 18′ to form the OR function described in connection with FIG. 1 so as to control the potential of the common terminal 62′. Diodes 19′ function to supply the potential of the common terminal 62 to the input of a selected stage which, in FIG. 1 and FIG. 2, is of the first stage 55′ of the ring counter.

As in the circuit of FIG. 1, the three diodes 19′ offer a large impedance between the common terminal 62′ and the input stage A as long as the potential difference thereacross remains below a minimum threshold level. However, when the potential thereacross rises above such threshold level, the diodes 19' become quite conductive and the impedance thereof drops to a very low value, thus permitting the increase in the potential of the common terminal 62 to be reflected through the three diodes 19' to the input of stage A and thereby cause energization of stage A.

It is to be understood that the forms of the inventions described and shown herein are but preferred embodiments thereof and that various changes may be made in circuit design and arrangement without departing from the spirit or the scope of said invention.

I claim:

1. In combination with a ring counter having a plurality of stages, starting circuit means for starting said ring counter at a given stage, each stage of said ring counter comprising:

first input terminal means;

output terminal means whose potential will be at a first level or a second level depending upon the energization or de-energization of said stage, means connecting the output terminal of each stage to the said first input terminal of the next adjacent stage in the ring of stages;

and pulse generating means for supplying pulses to said ring counter to cause stepping of the count within said ring counter from stage to stage;

said starting circuit means comprising:

common terminal means;

a plurality of diodes each having its high impedance presenting electrode connected to an individual one of said output terminals of said stages, and its low impedance presenting terminal connected to said common terminal means;

voltage source means and impedance means connected in series arrangement to said common terminal means and constructed to maintain the potential of said common terminal means substantially at the lowest actual potential of any of said output terminals;

and starting signal connecting means connected between said common terminal means and said first input means of the selected stage in which counting is to be initiated and constructed to supply the potential existing at said common terminal means to the first input means of said selected stage when said potential is above a predetermined threshold.

2. Starting circuit means in accordance with claim 1 in which said starting signal connecting means comprises:

means for substantially isolating the potential of said common terminal means from the said first input terminal of the stage in which counting is to be initiated when the potential of said common terminal means is below a certain threshold potential and to transmit potentials above said threshold potential to said first input means.

3. In combination with a ring counter having a plurality of stages, starting circuit means for starting the ring counter at a given stage, each stage of said ring counter comprising:

first input terminal means;

output terminal means whose potential will be at a first level or a second level depending upon the energization or de-energization of said stage;

means connecting the output terminal of each stage to the said first input terminal of the next adjacent stage in the ring of stages;

and pulse generating means for supplying pulses to said ring counter to cause stepping of the count within said ring counter from stage to stage;

said starting circuit means comprising:

OR circuit means comprising:

an output terminal;

plurality of input terminals individually connected to the output terminals of each of said stages;

said OR circuit means being constructed to respond to the signals appearing at said output terminals to produce an output signal of a first level when all of said stages are de-energized and to produce an output signal of a second level when any of said stages is energized;

and starting signal means connected between the output terminal of said OR circuit means and the first input terminal of said given stage to supply said first level output signal of said OR circuit means to the first input terminal of said given stage to energize said given stage.

4. Starting circuit means in accordance with claim 3 in which said starting signal connecting means comprises:

means for substantially isolating the said second level output signal of said OR circuit means from the said first input terminal of said given stage.

References Cited by the Examiner

UNITED STATES PATENTS

| | | | |
|---|---|---|---|
| 2,868,455 | 1/1959 | Bruce et al. | 307—88.5 |
| 2,876,365 | 3/1959 | Slusser | 307—88.5 |

ARTHUR GAUSS, *Primary Examiner.*

J. HEYMAN, *Assistant Examiner.*